United States Patent
Inaba et al.

[11] Patent Number: 5,854,724
[45] Date of Patent: Dec. 29, 1998

[54] MAGNETIC HEAD SUSPENSION ASSEMBLY

[75] Inventors: Masaichi Inaba; Hirofumi Matsumoto, both of Ushiku; Yasuyuki Tanaka, Tsuchiura, all of Japan

[73] Assignee: Nippon Mektron, Ltd., Tokyo, Japan

[21] Appl. No.: 693,463

[22] Filed: Aug. 2, 1996

Related U.S. Application Data

[62] Division of Ser. No. 465,760, Jun. 6, 1995, Pat. No. 5,673,484.

[30] Foreign Application Priority Data

Jul. 26, 1994 [JP] Japan .................................. 6-193662

[51] Int. Cl.$^6$ ....................................................... G11B 5/48
[52] U.S. Cl. .............................................................. 360/104
[58] Field of Search ................................ 360/104–106, 360/108

[56] References Cited

U.S. PATENT DOCUMENTS

| | | | |
|---|---|---|---|
| 4,208,257 | 6/1980 | Homma et al. | 216/13 |
| 4,670,804 | 6/1987 | Kant et al. | 360/102 |
| 4,761,699 | 8/1988 | Ainslie et al. | 360/103 |
| 4,996,623 | 2/1991 | Erpelding et al. | 360/104 |
| 5,006,946 | 4/1991 | Matsuzaki | 360/104 |
| 5,391,842 | 2/1995 | Bennin et al. | 360/104 |
| 5,392,179 | 2/1995 | Sendoda | 360/104 |
| 5,422,764 | 6/1995 | McIlvanie | 360/97.01 |
| 5,491,597 | 2/1996 | Bennin et al. | 360/104 |
| 5,530,604 | 6/1996 | Pattanaik | 360/104 |
| 5,597,496 | 1/1997 | Masaichi et al. | 216/94 |
| 5,612,840 | 3/1997 | Hiraoka et al. | 360/104 |
| 5,631,786 | 5/1997 | Erpelding | 360/97.01 |
| 5,666,717 | 9/1997 | Matsumoto et al. | 29/603.12 |
| 5,673,484 | 10/1997 | Masaichi et al. | 29/896.93 |
| 5,680,274 | 10/1997 | Palmer | 360/104 |
| 5,694,270 | 12/1997 | Sone et al. | 360/104 |
| 5,696,651 | 12/1997 | Endo et al. | 360/104 |
| 5,699,212 | 12/1997 | Erpelding et al. | 360/104 |
| 5,712,749 | 1/1998 | Gustafson | 360/104 |
| 5,717,547 | 2/1998 | Young | 360/104 |

FOREIGN PATENT DOCUMENTS

| | | |
|---|---|---|
| 53-74414 | 7/1978 | Japan . |
| 63-113917 | 5/1988 | Japan . |
| 3-248308 | 11/1991 | Japan .................................. 360/104 |

*Primary Examiner*—Jefferson Evans
*Attorney, Agent, or Firm*—Alix, Yale & Ristas, LLP

[57] ABSTRACT

A magnetic head suspension assembly, wherein a wiring member for connecting a magnetic head element with a read/write amplifier circuit board is integrally formed with the suspension for supporting the magnetic head element. The suspension is equipped integrally with a circuit wiring pattern via a flexible insulating base material. The flexible insulating base material is made as wide as the circuit wiring pattern. The top surface of the circuit wiring pattern has a surface protecting layer which is wider than the circuit wiring pattern.

20 Claims, 4 Drawing Sheets

MAGNETIC HEAD SUSPENSION ASSEMBLY

This is a divisional of application Ser. No. 08/465,760 filed on Jun. 6, 1995, now U.S. Pat. No. 5,673,484.

BACKGROUND OF THE INVENTION (1) Field of the Invention

The present invention generally relates to a magnetic head suspension assembly used for a magnetic disk unit or the like, and a method of manufacturing the same. More particularly, the present invention relates to a magnetic head suspension assembly wherein a wiring member for connecting a magnetic head element with a read/write amplifier circuit board is integrally formed with a suspension and a method of manufacturing the same.

(2) Description of the Related Art

This type of magnetic disk unit is equipped with at least one rotary disk for magnetically recording Information, a magnetic head element, for reading from or writing to, each track on the disk, and a head positioning actuator which is connected with the head element. The positioning actuator is used to move the head element to a desired track and maintain the head element above the selected track.

An example of a conventional magnetic head suspension assembly is disclosed in Japanese Patent Laid-Open No. 63-113917. In this art, the magnetic head element is attached to a flexure by epoxy resin or the like and the flexure is installed on a load beam by laser welding or the like. Gold-plated copper lead wire provided with urethane coating or the like is connected by ultrasonic bonding, soldering, or the like to an electrode formed on the magnetic head element, thus forming a leader wiring section for sending a signal from the magnetic head to an external circuit. The wiring member is turned a number of times before it is housed in a flexible insulating resinous tube, and mounted on the suspension by crimping a part of the suspension or other similar means.

Such a magnetic head suspension assembly suffers from the problem that the connection between an electrode on the magnetic head element and the leader wiring is extremely inefficient due to restrictions on operability, making it difficult to achieve higher productivity. This problem has been exacerbated by the increasing number of terminals resulting from the reduced sizes of magnetic head elements and the increasing use of MR elements in recent years. Furthermore, an additional problem arises because the rigidity of the leader wiring member prevents the magnetic head element from obtaining an optimum position when it floats. A final problem is that the leader wiring member is subjected to wind pressure from air flow produced by a rotating recording medium which disturbs the position of a floating magnetic head element.

To solve these problems, the art disclosed in Japanese Patent Laid-Open NO. 53-74414 employs a flexible circuit board, which also serves as the leader wiring member and the suspension mechanism to support the magnetic head element. This art, however, presents many problems in achieving accurate positioning, applying the appropriate load, and achieving the appropriate floating position of the magnetic head element. Since these are all basically required of the suspension mechanism, it can hardly be employed for the magnetic disk units with higher density used these days.

According to one popular approach to solving the problems regarding conventional leader wiring, a flexible circuit board, which is used to include all wiring, is attached to a suspension spring with an adhesive agent or the like. This approach, however, unavoidably trades off weight reduction for operability because a separate flexible circuit board must be glued to the suspension spring. Whereas, preferably, the composing member which serves as a servo mechanical element should be lighter to meet the demand for fast seek, etc.

Hence, there has been a demand for a magnetic suspension assembly which reduces the adverse influences on the floating position of the magnetic head exerted by the leader wiring member and also permits easier mounting of the magnetic head element by combining the leader wiring member and the suspension into one piece.

SUMMARY OF THE INVENTION

It is, accordingly, an object of the present invention to provide a magnetic head suspension assembly with circuit wiring which allows a leader wiring member and a suspension to be combined into a single magnetic head unit and a method of manufacturing the same.

To this end, the present invention provides a method of manufacturing a magnetic head suspension assembly which includes the steps of: (1) forming a laminated plate having a flexible insulating base material with a springy (i.e. resilient) metal layer on one surface and an electrically conductive layer on the other surface; (2) photoetching the electrically conductive layer of the laminated plate to produce a desired circuit wiring pattern; (3) removing the flexible insulating base material from an exposed area by irradiation with excimer laser beams, plasma etching, or resin etching; (4) forming a surface protecting layer on the surface of the circuit wiring pattern by the photofabrication process employing a photosensitive insulating resin; (5) photoetching the springy metal layer and bending the springy metal layer into a predetermined shape to form a suspension having a desired shape.

The flexible insulating base material of the aforementioned laminated plate may be a non-photosensitive polyimide made of a soluble polyimide or polyimide precursor of the like. Some examples of appropriate polyimides include polyamic acid, or a photosensitive insulating resin made of photosensitive polyimide, photosensitive epoxy resin, photosensitive acrylic resin, or the like.

Using the aforementioned materials makes it possible to easily form the insulating base material into a desired shape by carrying out the removing treatment using a relatively mild chemical. A further advantage is that the curing process can be performed without the need of the ablation removing treatment using excimer laser beams or the resin etching removal process which uses a hazardous chemical such as hydrazine to partially remove the insulating base material after forming the circuit wiring pattern.

After forming the insulating base material into the desired shape, the surface protecting layer is formed on the surface of the circuit wiring pattern by the photofabrication process using photosensitive insulating resin in the manner described above. Then, the aforementioned springy metal layer is photoetched and bent into a predetermined shape, thereby producing a suspension of a desired shape.

DESCRIPTION OF THE PREFERRED EMBODIMENTS

Figure 1:
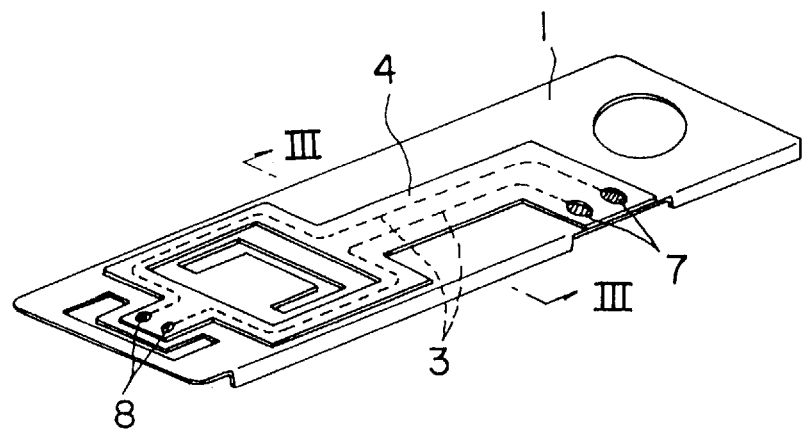
FIG. 1 is a conceptual perspective view showing a magnetic head suspension produced by the manufacturing method in accordance with the present invention.
Figure 2:
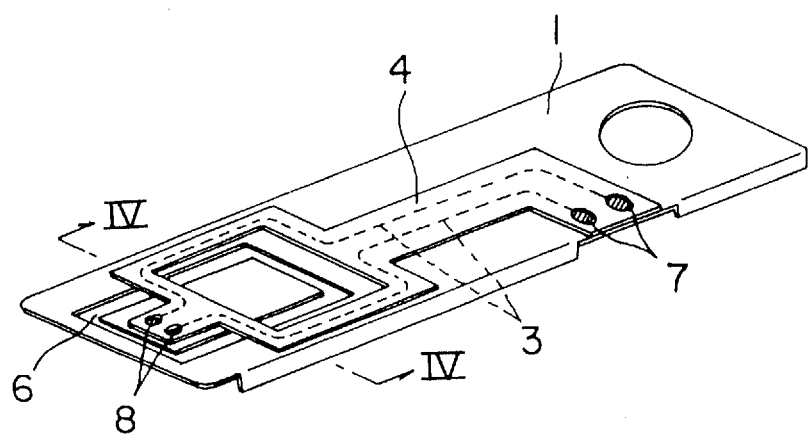
FIG. 2 is a conceptual perspective view showing another example of the magnetic head suspension produced by the manufacturing method in accordance with the present invention.

FIG. 1 and FIG. 2 are conceptual perspective views of the magnetic head suspension assembly produced by the method of manufacturing of the present invention. In the magnetic head suspension shown in FIG. 1 and FIG. 2, the wiring member for connecting a magnetic head element with a read/write amplifier circuit board and the suspension are combined into one piece.

According to the embodiment of the magnetic head suspension shown in FIG. 1, the flexible insulating base material and a circuit wiring pattern 3, which is formed on the insulating base material and covered with a surface protecting layer 4, are formed into one piece on a suspension 1 made of springy metal.

The embodiment of the magnetic head suspension shown in FIG. 2 is the same as that shown in FIG. 1 except that a part of the suspension, i.e. the flexing section of the flexure, is etched to produce an opening 6, and that the flexing section is composed only of a part of each of the flexible insulating base material, the circuit wiring pattern 3, and the surface protecting layer 4, respectively.

In the embodiments shown in the two drawings, holes are formed in predetermined positions of the surface protecting layer 4 to make the connecting terminal section for the magnetic head element. The holes expose a part of the circuit wiring pattern 3 which can be coated with a layer of solder, gold, or the like to form connecting terminals 8. An end of the suspension 1 has terminals 7 for external connection which are formed in the same manner.

Figure 3:
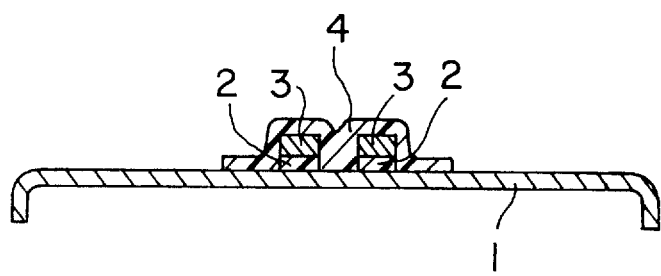
FIG. 3 is a conceptual cross-sectional block diagram taken along line III—III of FIG. 1.
Figure 4:
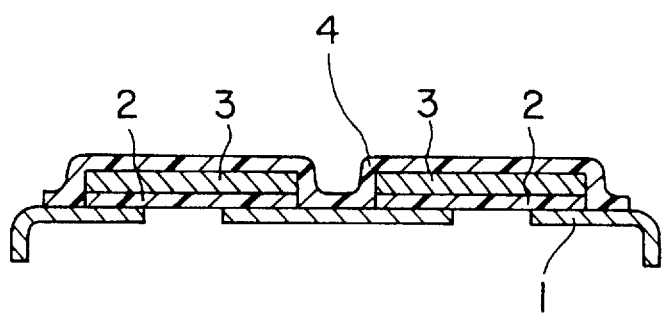
FIG. 4 is a conceptual cross-sectional block diagram taken along line IV—IV of FIG. 2.

FIG. 3 is a conceptual cross-sectional block diagram taken along line III—III of FIG. 1. FIG. 4 is a conceptual cross-sectional block diagram taken along line IV—IV of FIG. 2. In FIG. 3 and FIG. 4, reference numeral 1 denotes a suspension made of springy metal such as stainless steel. A predetermined surface area of the suspension 1 which has the same width as the circuit wiring pattern is covered with the flexible insulating base material 2 made of polyimide, epoxy resin, acrylic resin, or the like. The desired circuit wiring pattern 3 is formed on the surface of the flexible insulating base material 2. Further, the surface protecting layer 4, which is made of a photosensitive insulating resin or the like, is formed on the surface of the circuit wiring pattern 3. This surface protecting layer 4 is wider than the circuit wiring pattern 3.

FIG. 5a through FIG. 5d illustrate one method of manufacturing embodiment of the present invention. The manufacturing process views given in FIG. 5a through FIG. 5d illustrate the sections taken along line III—III shown in FIG. 1.

Figure 5A:
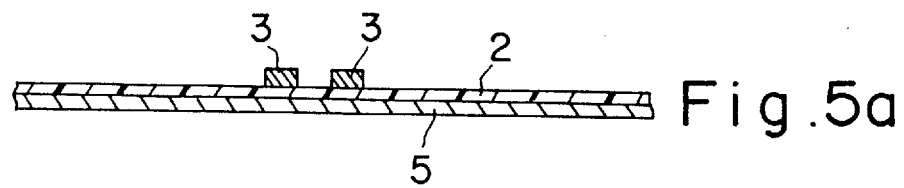
FIG. 5a through FIG. 5d illustrate one embodiment of the method of manufacturing the magnetic head suspension according to the present invention.

In FIG. 5a, the flexible insulating base material 2 made of polyimide, epoxy resin, acrylic resin, or the like, has a springy metal layer 5 of stainless steel or the like, for forming the suspension, on one surface, and a laminated plate having an electrically conductive layer of copper foil or the like on the other surface. The electrically conductive layer is photoetched to produce a desired circuit wiring pattern 3. For better flexibility, a laminated plate with no adhesive agent between its layers should be used; however, a laminated plate formed with the use of an adhesive agent may be used when an excimer laser is employed. The following process uses the adhesive-less laminated plate.

Figure 5B:
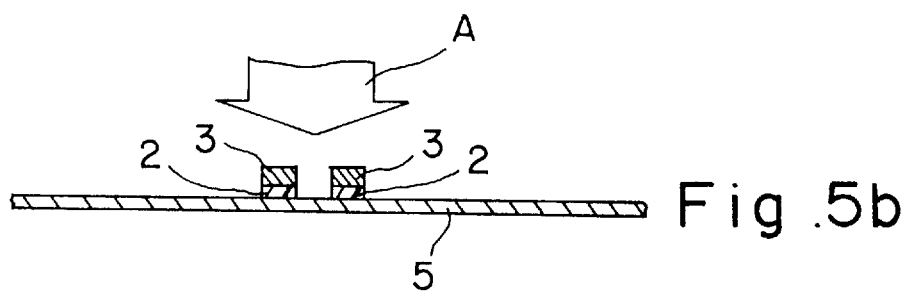

In the next step, as illustrated in FIG. 5b, the exposed area of the insulating base material 2 is irradiated by an excimer laser beam A. The insulating base material is removed by ablation to form the circuit wiring pattern 3. Alternatively, the exposed insulating base material 2 can also be removed by plasma etching or by resin-etching with a strong alkaline chemical such as hydrazine, where the circuit wiring pattern 3 is used as the etching mask.

Figure 5C:
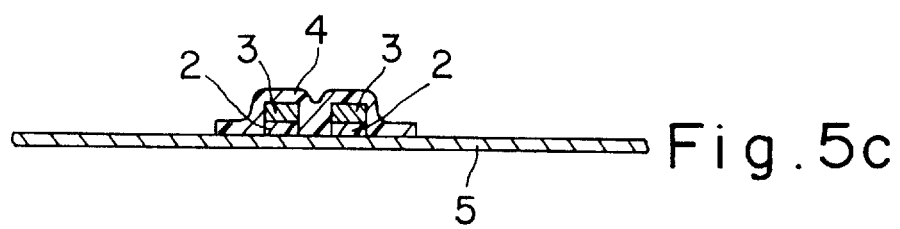

Then, as shown in FIG. 5c, photosensitive insulating resin is applied to the circuit wiring pattern 3. The photosensitive insulating resin is then exposed, developed and cured to produce the wide surface protecting layer 4 clad onto the circuit wiring pattern 3.

Figure 5D:
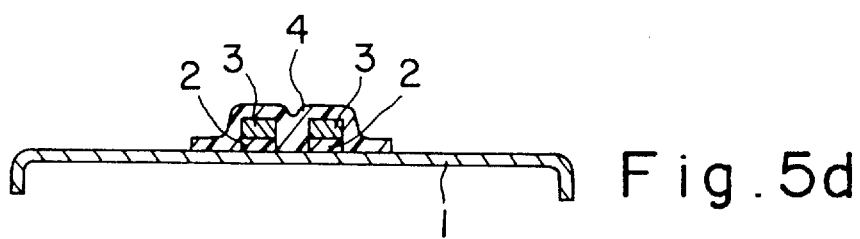

Lastly, as shown in FIG. 5d, the springy metal layer 5 is photoetched and bent into a desired shape to form the suspension 1, thus producing the magnetic head suspension combined with the circuit wiring into one piece.

FIG. 6a through FIG. 6d illustrate a similar embodiment of the method of manufacturing a magnetic head suspension assembly according to the present invention. The laminated plate used for this embodiment has a flexible insulating base material 2 made of a nonphotosensitive polyimide composed of a soluble polyimide or a polyimide precursor or the like such as polyamic acid. The flexible insulating base material 2 has a springy metal layer 5 of stainless steel or the like, for forming the suspension, on one surface and an electrically conductive layer of copper foil or the like on the other surface.

To obtain such a laminated plate, the non-photosensitive polyimide is clad to one surface of the springy metal layer or the electrically conductive layer, then the metal layer is attached and they are subjected to precuring treatment to complete the laminated plate. Alternatively, the metal layer may be attached after the precuring treatment to complete the laminated plate. As another alternative, the non-photosensitive polyimide is clad to one surface of the springy metal layer and also to one surface of the electrically conductive layer, then they are subjected to the precuring treatment to laminate them or they are laminated before the precuring treatment to complete the laminated plate.

The electrically conductive layer of the laminated plate thus produced, is photoetched to form the desired circuit wiring pattern 3.

Figure 6A:
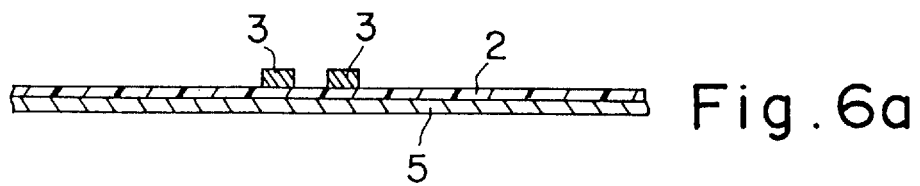
FIG. 6a through FIG. 6d illustrate another embodiment of the method of manufacturing a magnetic head suspension according to the present invention.
Figure 6B:
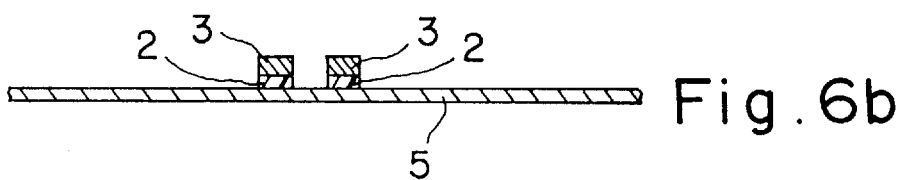

As shown in FIG. 6b, the circuit wiring pattern 3 can be used as a resist layer, and the exposed insulating base material 2 removed with a developer suited for the insulating resin before it is subjected to the curing process. This results in the same construction as that shown in FIG. 5b.

Figure 6C:
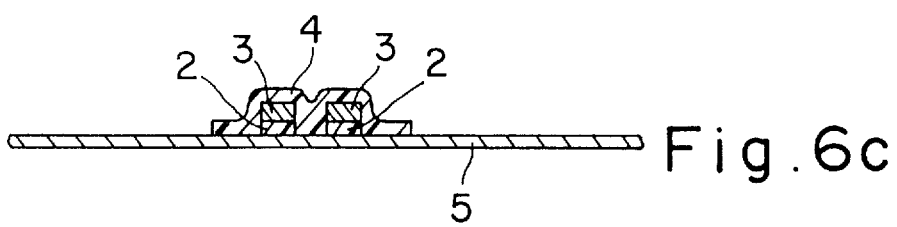
Figure 6D:
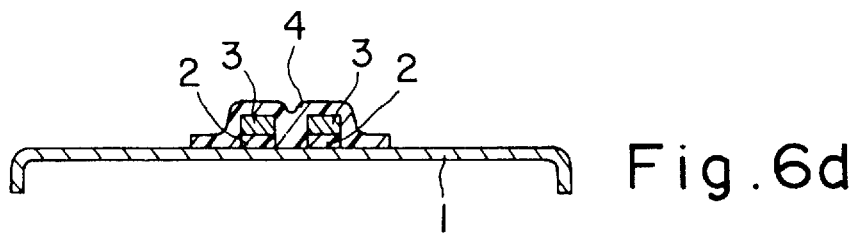

Next, the steps of FIG. 6c and FIG. 6d are carried in same manner as those of FIG. 5c and FIG. 5d produce a single magnetic head suspension combined with the circuit wiring in the same manner as that in the embodiment described above.

An alternative embodiment of the present invention incudes a variation on the process illustrated in FIG. 6a and FIG. 6b. This alternative process uses a photosensitive insulating resin composed of photosensitive polyimide, photosensitive epoxy resin, photosensitive acrylic resin, or the like for the flexible insulating base material 2.

As described above, the flexible insulating base material 2 has a springy metal layer 5 of stainless steel or the like, for forming the suspension, on one surface and the laminated plate having the electrically conductive layer of copper foil or the like on the other surface. The same process as described in the embodiment above may be employed to make the laminated plate.

The electrically conductive layer of the laminated plate thus produced, is photoetched to form the desired circuit wiring pattern 3 as shown in FIG. 6a. As with the embodiment shown in FIG. 6b, by using the circuit wiring pattern 3 as a resist layer, the exposed area of the insulating base material 2 is removed by exposure and development before it is subjected to the curing process, thus obtaining the same construction as that shown in FIG. 6b.

Next, the steps illustrated in FIG. 6c and FIG. 6d, including the step for producing the surface protecting layer 4 and the step for producing the suspension 1, are carried out. Thus, a single magnetic head suspension combined with circuit wiring can be produced as in the embodiment described above.

The method of manufacturing the magnetic head suspension in accordance with the present invention allows the desired circuit wiring to be integrally formed with the suspension. Furthermore, making the width of the flexible insulating base material identical to the width of the circuit wiring pattern reduces the influence which the circuit wiring has on the spring (i.e. the flexibility of the suspension). The present invention is also advantageous in that it eliminates the need for gluing a discrete flexible circuit board to a suspension. Thus the present invention eliminates the need of trading off weight reduction for operability required in the prior art.

In addition, using a non-photosensitive polyimide or photosensitive Insulating resin for the flexible Insulating base material of the laminated plate makes it possible to form the insulating base material into a desired shape by using a mild chemical instead of a hazardous chemical such as hydrazine.

The method of manufacturing a magnetic head suspension of the present invention makes it possible to stably provide a magnetic head suspension with circuit wiring, the head being capable of achieving improved operability and reduced weight. The present invention also permits the accurate positioning, the application of appropriate load, and the achievement of a floating position of the magnetic head element as required of a magnetic head suspension.

What is claimed is:

1. A magnetic head suspension assembly comprising:
   a resilient suspension member, said suspension member being comprised of metal;
   a layer of flexible insulating base material supported on said suspension member, said base material being comprised of a polyimide;
   a circuit wiring pattern carried by said layer of flexible insulating base material; and
   a surface protecting layer at least partially located on the surface of said circuit wiring pattern, said suspension member being provided with an opening, said flexible insulating base material covering at least a portion of said opening to provide a flexible support for said circuit wiring pattern across said opening.

2. A magnetic head suspension assembly according to claim 1, wherein said base material and said circuit wiring pattern each have a width, said circuit wiring pattern width being substantially equal to said width of said layer of said flexible insulating base material.

3. A magnetic head suspension according to claim 1, wherein said flexible insulating base material is a non-photosensitive polyimide.

4. A magnetic head suspension according to claim 1, wherein said flexible insulating base material is a polyimide selected from the group consisting of polyamic acid, a photosensitive insulating resin made of photosensitive polyimide, a photosensitive epoxy resin and photosensitive acrylic resin.

5. A magnetic head suspension according to claim 1, wherein said circuit wiring pattern is formed by a photofabrication process.

6. A magnetic head suspension according to claim 1, wherein said surface protecting layer is formed by a photofabrication process employing a photosensitive insulating resin.

7. A magnetic head suspension according to claim 1, wherein said circuit wiring pattern has a perimeter and wherein said surface protecting layer entirely envelopes said circuit wiring pattern except at predetermined holes through said surface protecting layer which are spaced inwardly from said perimeter of said circuit wiring pattern to thereby define connecting terminals.

8. A magnetic head suspension according to claim 1, wherein said magnetic head suspension assembly is formed without using adhesives.

9. A magnetic head suspension assembly comprising:
   a resilient suspension member;
   a layer of flexible insulating base material formed on said suspension member by a photofabrication process, said base material having a width and being comprised of a polyimide;
   a circuit wiring pattern formed on said base material by a photofabrication process, said circuit wiring pattern having a width which is substantially equal to said base material width; and
   a surface protecting layer formed on at least a portion of said circuit wiring pattern by a photofabrication process.

10. A magnetic head suspension according to claim 9, wherein said suspension member defines an opening and wherein said base material covers at least a portion of said opening to provide a flexible support for said circuit wiring pattern across said opening.

11. A magnetic head suspension according to claim 9, wherein said base material has a shape which is at least in part formed by irradiation with excimer laser beams.

12. A magnetic head suspension according to claim 9, wherein said flexible insulating base material is a non-photosensitive polyimide.

13. A magnetic head suspension according to claim 9, wherein said flexible insulating base material is a polyimide selected from the group consisting of polyamic acid, a photosensitive insulating resin made of photosensitive polyimide, a photosensitive epoxy resin and photosensitive acrylic resin.

14. A magnetic head suspension according to claim 9, wherein said surface protecting layer is formed by a photofabrication process employing a photosensitive insulating resin.

15. A magnetic head suspension according to claim 9, wherein said circuit wiring pattern has a perimeter and wherein said surface protecting layer entirely envelopes said circuit wiring pattern except at predetermined holes through said surface protecting layer which are spaced inwardly from said perimeter of said circuit wiring pattern to thereby define connecting terminals.

16. A magnetic head suspension according to claim 9, wherein said magnetic head suspension assembly is formed without using adhesives.

17. A magnetic head suspension assembly comprising:
- a resilient suspension member, said suspension member including at least first and second coplanar portions arranged such that said first portion is entirely contained within and spatially isolated from said second portion to thereby define an endless opening therebetween;
- a layer of flexible insulating base material at least in part supported on said suspension member, said base material bridging said first and second portions of said suspension to thereby provide a flexible support for a circuit wiring pattern;
- a circuit wiring pattern at least in part formed on said base material and carried by said base material across said opening; and
- a surface protecting layer formed on at least a portion of said circuit wiring pattern.

18. A magnetic head suspension according to claim 17, wherein said surface protecting layer entirely envelopes said circuit wiring pattern except at predetermined holes extending through said surface protecting layer which are located within said first portion of said suspension member.

19. A magnetic head suspension according to claim 17, wherein said base material and said circuit wiring pattern have predetermined widths which are substantially equal to one another.

20. A magnetic head suspension according to claim 17, wherein said base material has a shape which is at least in part formed by irradiation with excimer laser beams.

* * * * *